United States Patent [19]

Fathauer et al.

[11] 4,100,497

[45] Jul. 11, 1978

[54] SELECTIVE RESCAN DELAY FOR MULTI-CHANNEL SCANNING RADIO RECEIVER

[75] Inventors: George H. Fathauer, Mesa, Ariz.; Cecil Ernest Mathis; Warren L. Williamson, both of Indianapolis, Ind.

[73] Assignee: Masco Corporation of Indiana, Taylor, Mich.

[21] Appl. No.: 741,475

[22] Filed: Nov. 12, 1976

Related U.S. Application Data

[62] Division of Ser. No. 545,432, Jan. 30, 1975, Pat. No. 4,027,251.

[51] Int. Cl.² .............................................. H04B 1/32
[52] U.S. Cl. .................................... 325/470; 325/465
[58] Field of Search ............... 325/334, 335, 419, 421, 325/457–459, 464, 465, 468–470

[56] References Cited

U.S. PATENT DOCUMENTS

| | | | |
|---|---|---|---|
| 3,750,032 | 7/1973 | Andrews | 325/470 |
| 3,821,651 | 6/1974 | Fathauer et al. | 325/470 |
| 3,824,475 | 7/1974 | Pflasterer | 325/470 |
| 3,961,261 | 6/1976 | Pflasterer | 325/470 |

Primary Examiner—Robert L. Griffin
Assistant Examiner—Jin F. Ng
Attorney, Agent, or Firm—Leon E. Redman

[57] ABSTRACT

A signal-seeking scanning radio receiver employing a selective rescan delay circuit for delaying automatic resumption of multi-channel scanning for a period of time following termination of a signal on a tuned channel in response to an auxiliary output signal from a memory programmed to provide auxiliary output signals only for certain preselected channels tuned to a predetermined frequency on which two-way communications are anticipated without delaying automatic scan resumption for channels on which only one-way communications are anticipated.

7 Claims, 4 Drawing Figures

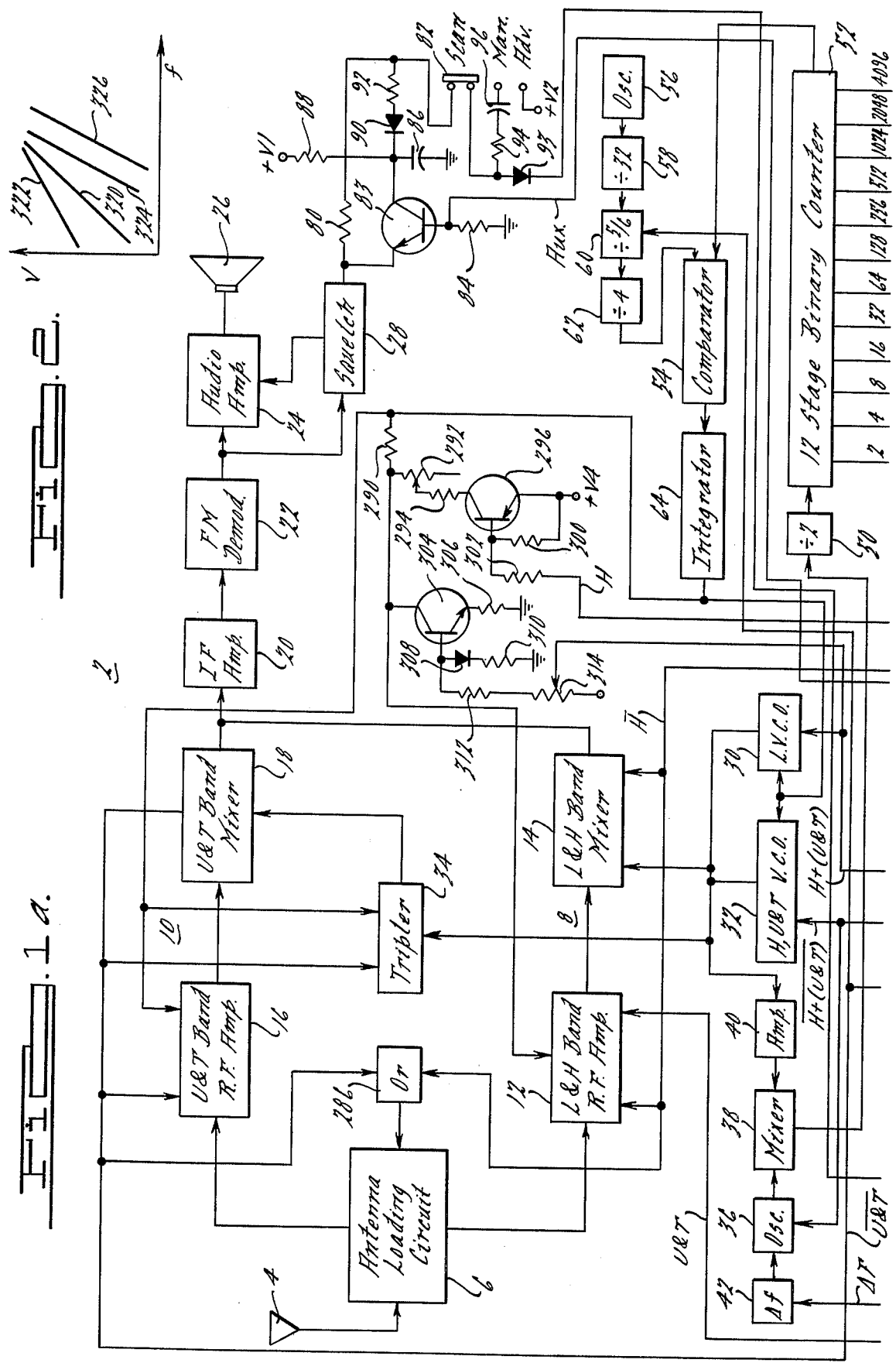

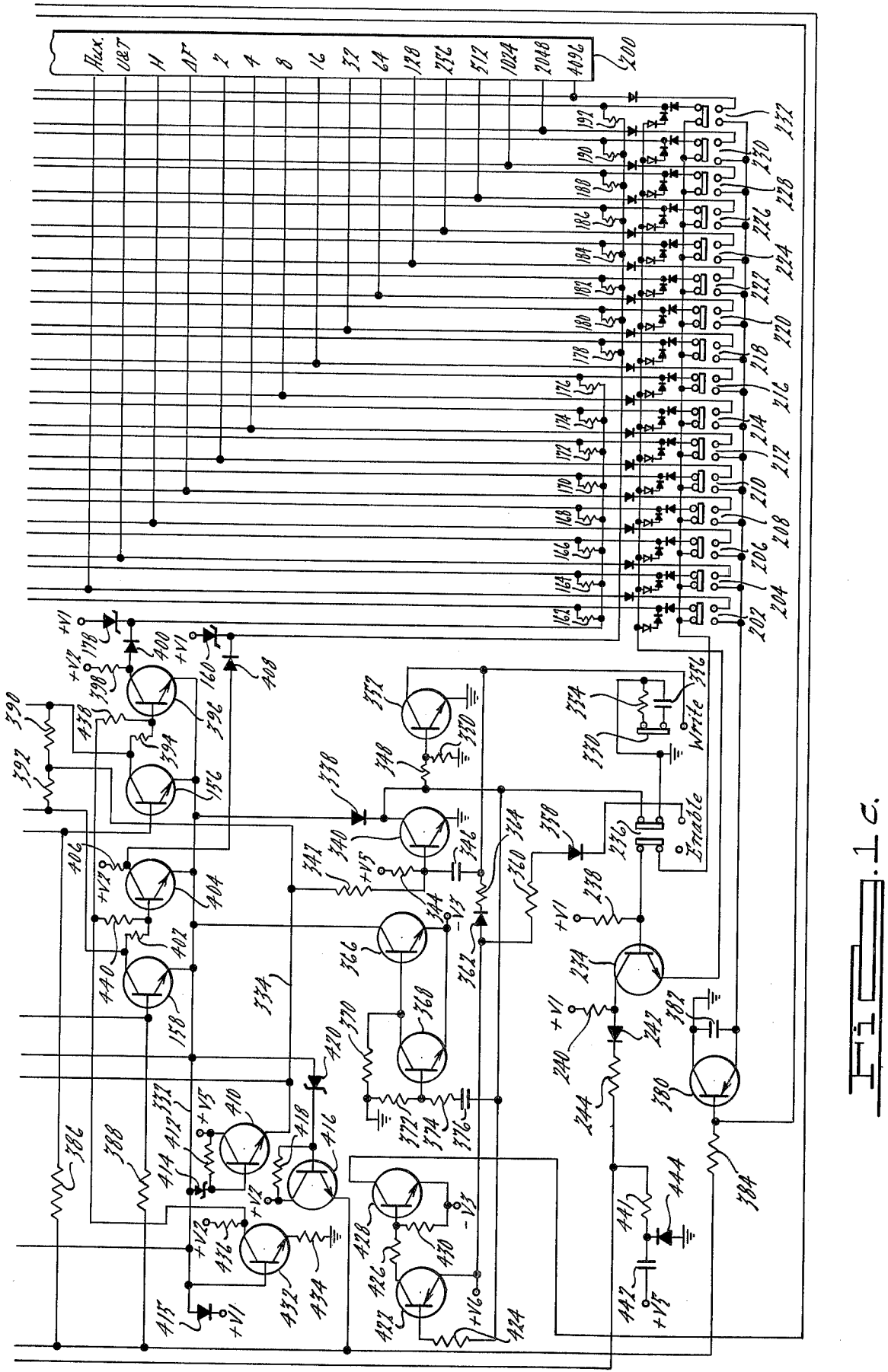

SELECTIVE RESCAN DELAY FOR MULTI-CHANNEL SCANNING RADIO RECEIVER

CROSS REFERENCE TO RELATED APPLICATION

This is a division of application Ser. No. 545,432, filed on Jan. 30, 1975, now U.S. Pat. No. 4,027,251 for a Radio Receiver Using Frequency Synthesizer by the same inventive entity and of common ownership herewith.

BACKGROUND OF THE INVENTION

1. Field of the Invention

This invention generally relates to scanning radio receivers and more particularly to signal-seeking radio receivers which automatically and sequentially scan a plurality of channels for tuning to predetermined radio frequencies, lock onto a tuned channel receiving a signal, and then automatically resume scanning upon termination of the received signal.

2. Description of the Prior Art

Scanning radio receivers which automatically and sequentially scan a plurality of channels for tuning to predetermined radio frequencies, lock onto a tuned channel receiving a signal, and upon termination of the received signal automatically resume the scan to locate another channel receiving a signal are now well known. Such a receiver is diclosed in U.S. Pat. No. 3,531,724, issued on Sept. 29, 1970, to George Fathauer and of common ownership herewith. This receiver employs semiconductor switching of crystals for determining the frequencies to which the receiver is tuned. These receivers gained immediate commercial acceptance and created the scanning radio receiver industry.

A scan delay feature has been incorporated into some commercially available scanning radio receivers. By actuating a scan delay switch, provided on these receivers, a user may cause the automatic resumption of the scan operation to be delayed for a period of time following termination of a signal on a receiving channel to enable the listener to hear a possible comeback communication if that channel is tuned to a frequency on which two-way communications occur. Such a receiver incorporating a scan delay circuit is disclosed in U.S. Pat. No. 3,824,475, issued on July 16, 1974, to Peter W. Pflasterer.

A major drawback in employing a scan delay circuit is that it causes a delay upon termination of each signal received on every channel, regardless of the mode of communication. Such delays on channels that are tuned to frequencies on which only one-way communications occur are needless since any possible comeback communication would be at a different frequency. These needless scan delays significantly increase the overall scan time thereby resulting in missed communications on other channels. For this reason, the conventional non-selective scan delay feature is highly undesirable and has not been uniformly adopted by the scanning radio industry.

SUMMARY OF THE INVENTION

Accordingly, it is a primary object of this invention to delay the scan operation of a multi-channel scanning radio receiver to receive a comeback communication before resuming the scan operation, while minimizing overall scan time.

It is another object of this invention to avoid wasting time in delaying scan operation on channels tuned to a radio frequency on which two-way communications normally do not occur.

It is a further object of this invention to facilitate user programming of certain channels preselected to operate with a rescan delay.

These objects are achieved in the scanning radio receiver of the present invention which provides selective rescan delay at only certain chosen radio frequencies. Also, a system is provided for user programming of the certain radio frequencies chosen to operate with a rescan delay.

Various other objects, advantages, and meritorious features of the present invention will become more fully appreciated when considered with the following detailed description, appended claims, and accompanying drawing.

DESCRIPTION OF THE DRAWING

FIGS. 1a, 1b, and 1c comprise a diagram partly in block form and partly in schematic form of a radio receiver of this invention; and FIG. 2 is a set of graphs useful for explaining the operation of a portion of the receiver of FIG. 1.

DESCRIPTION OF THE PREFERRED EMBODIMENT

Figure 1B:
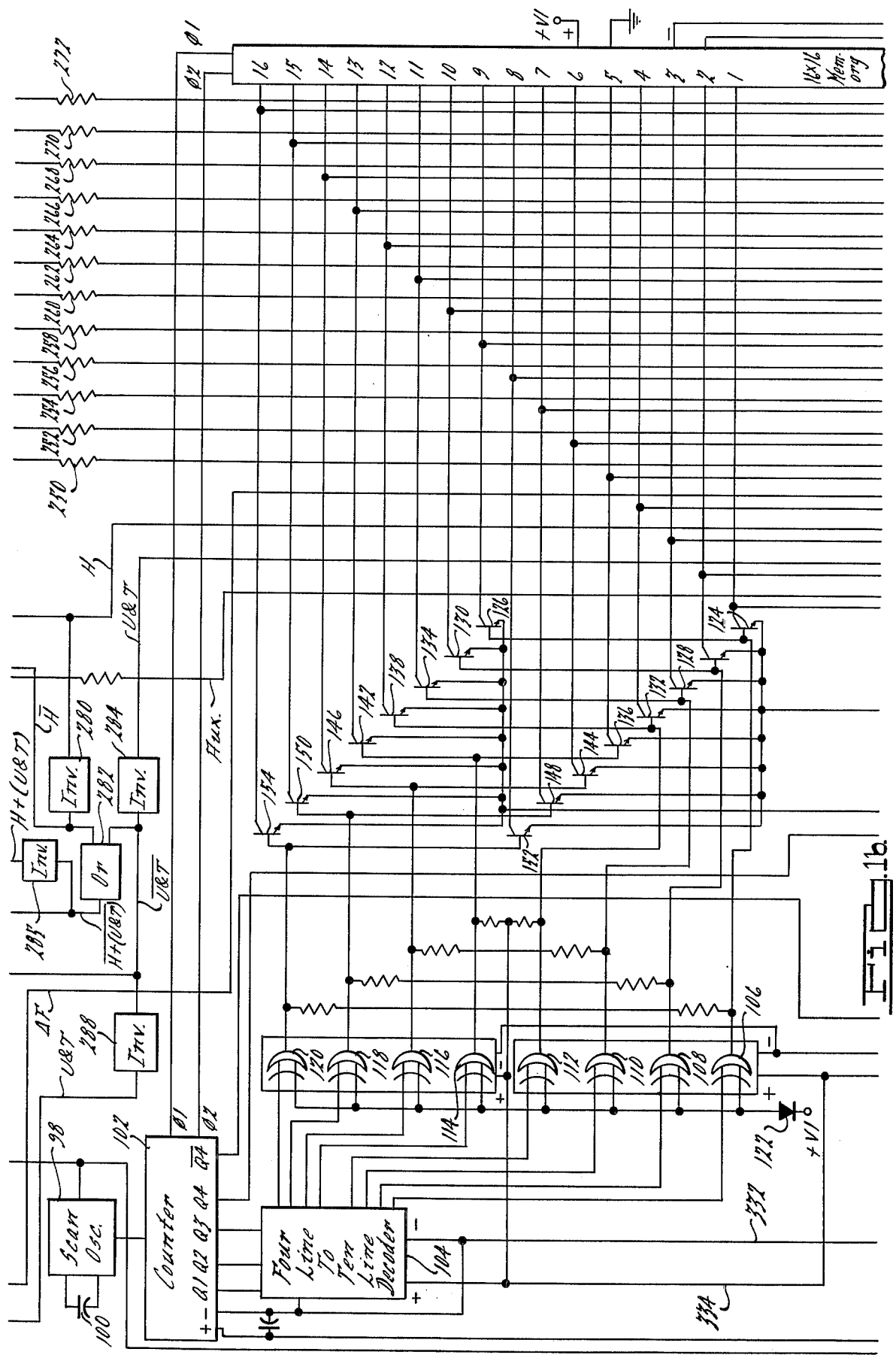

There is disclosed in FIG. 1 a radio receiver including one embodiment of this invention. It will be understood, of course, that this invention is of much wider applicability than the single embodiment disclosed and that the invention is not to be limited to that embodiment.

The receiver 2 of FIG. 1 is a scanning radio receiver for reception of the radio frequencies designated by the United States Federal Communications Commission as being available for assignment to the Public Safety Radio Services. That designation appears at Part 89, Title 47, Code of Federal Regulations. The designated frequencies are commonly referred to as falling within four separate radio frequency bands, the "low" or "L" band including the designated frequencies falling within the range of approximately 30–50 MHz., the "high" or "H" band including the designated frequencies falling within the range of approximately 150–173 MHz., the "ultra-high frequency" or "U" band including the designated frequencies falling within the range of approximately 453–469 MHz., and the "television" or "T" band including the designated frequencies falling within the range of approximately 470–512 MHz. In the L band, the designated frequencies are spaced from each other by multiples of 20 kHz. and each occurs at a multiple of 20 kHz. In the H band, all channels falling within the subband frequency range of approximately 150–160 MHz. are spaced from each other by multiples of 15 kHz., the lowest frequency within this subband being 150.995 MHz., and all channels falling within the subband of 170–173 MHz. are spaced from each other by multiples of 50 kHz., the lowest frequency within this subband being 170.425 MHz. The H band includes one additional designated frequency not in the two mentioned subbands at 166.250 MHz. In the U band, the designated frequencies are spaced from each other by multiples of 25 kHz. and each occurs at a multiple of 25 kHz. In the T band, the designated frequencies are spaced from each other by multiples of 25 kHz., but each occurs at a frequency displaced from a multiple of 25 kHz. by 12.5 kHz. Frequency modulation is used on the signals at the designated frequencies. It is desirable for a receiver useful for the Public Safety Radio Services to be capable of receiving signals at each of the assigned frequencies in each of the L, H, U, and T bands.

The receiver 2 disclosed herein is shown in three parts, FIGS. 1a, 1b, and 1c, for convenience of drawing. The complete receiver may be seen by placing each of the figures in a horizontal orientation and arranging them vertically so that FIG. 1a is at the top, FIG. 1b in the middle, and FIG. 1c at the bottom. The interconnections between the circuitry shown in the three figures will be evident when they are so arranged.

The receiver 2 is capable of receiving radio signals on any of the frequencies assigned to the Public Safety Radio Services and is capable of scanning between any number up to sixteen of preselected ones of those frequencies arranged in any order. The receiver has 16 channels of operation, and each channel may be set to tune the receiver to any one of the designated frequencies. It is such that it will tune to one of the preselected frequencies and, if there is a signal at that frequency, remain tuned thereto. If there is no signal at that frequency, or the signal present is terminated, the receiver will successively tune itself to all the preselected frequencies until one is reached having a signal thereon. It will stop on the first frequency it reaches having a signal and remain tuned thereto until that signal terminates, when the receiver will recommence the described scanning operation.

As shown in FIG. 1, the receiver 2 includes an antenna 4 coupled through an antenna loading circuit 6 to two radio frequency sections 8 and 10. Radio frequency section 8 is operative on the L and H bands and comprises a radio frequency amplifier 12 and a mixer 14 while radio frequency section 10 is operative on the U and T bands and comprises a radio frequency amplifier 16 and a mixer 18. The radio frequency amplifiers 12 and 16 and the U and T band mixer 18 each include control inputs by which the normal operation of the respective circuits may be either enabled or disabled. The H and L band mixer 14 has a control input by which the gain thereof may be varied. Radio frequency amplifiers 12 and 16 include variable frequency filter sections coupled to tracking inputs of the amplifiers which are effective to tune the amplifiers in response to the signals present at the respective tracking inputs. Further, radio frequency amplifier 12 has another control input to alter the band of operation of that amplifier between the L and H bands. The antenna 4 is normally tuned to receive relatively high frequency signals in the H, U, and T bands, but antenna loading circuit 6 has a control input by which the loading of the antenna may be altered to tune it to receive signals in the L band. The outputs of the mixers 14 and 18 are both coupled to an intermediate frequency amplifier 20 which, in turn, is coupled to an f.m. demodulator 22, an audio amplifier 24, and a speaker 26 in the conventional fashion. An output of audio amplifier 24 is also coupled to a noise actuated squelch circuit 28. Squelch circuit 28 is coupled to audio amplifier 24 to disable the operation thereof when no signal above the receiver squelch level is received on the frequency to which the receiver 2 is tuned. Intermediate frequency amplifier 20 is operative at a frequency of 10.8 MHz. The intermediate frequency amplifier 20, detector 22, audio amplifier 24, and squelch circuit 28 may take on a variety of forms; the construction of circuits to suitably perform the functions thereof will be readily apparent to those of ordinary skill in the art and, thus, they need not be further discussed here. The circuitry of antenna loading circuit 6, radio frequency amplifiers 12 and 16, and mixers 14 and 18 may be very similar to the circuits performing similar functions more fully discussed in copending application of George H. Fathauer filed on Nov. 4, 1974, Ser. No. 520,438 for Multiband Scanning Radio Receiver, herein incorporated by reference.

The apparatus for generating the local oscillator signals applied to mixers 14 and 18 will not be described in detail. It includes a first voltage controlled oscillator (v.c.o.) 30 and a second v.c.o. 32. Voltage controlled oscillator 30 is operative to produce at its output a signal which varies in frequency over the range of approximately 19.2–39.2 MHz. in accordance with the magnitude of the voltage applied to a tracking input thereof and v.c.o. 32 is operative to produce at its output a signal which varies in frequency over the range of 139.2–166.8 MHz. in accordance with the magnitude of the voltage applied at a tracking input thereof. Voltage controlled oscillator 30 and v.c.o. 32 each have a control input to which a proper signal must be applied to enable the operation of the oscillator. In the absence of such a signal, the oscillator is disabled and not operative. The output of v.c.o. 32 is applied to an input of a tripler 34. The tripler 34 includes a control input by which the operation of that circuit may be enabled or disabled. When tripler 34 is enabled, it generates at its output a signal at three times the frequency of the signal applied thereto. The frequency of operation of tripler 34 may be varied in accord with a signal applied to a tracking input thereof so that its frequency of operation will correspond to that of v.c.o. 32. The output of v.c.o. 32 is additionally applied to a second input of the L and H band mixer 14 and the output of L band v.c.o. 30 is likewise applied to that same input of mixer 14. As will subsequently be further discussed, v.c.o. 30 is operative when receiver 2 is tuned to a frequency in the L band and v.c.o. 32 is operative when the receiver is tuned to a frequency in either of the H, U, or T bands.

The local oscillator circuit of receiver 2 further includes an offset oscillator 36 which generates a signal at approximately 133 MHz. Oscillator 36 is preferably crystal controlled and includes a control input by which the operation of that oscillator may be either enabled or disabled. Its output is applied to a first input of a mixer 38. The outputs of v.c.o.'s 30 and 32 are coupled through an isolation amplifier 40 to a second input of mixer 38. The mixer 38 is operative to generate at its output a signal which, when v.c.o. 32 and oscillator 36 are operative, has a frequency equal to the difference between the frequencies of the two signals applied to the first and second inputs thereof but, when v.c.o. 30 is operative and oscillator 36 is inoperative, has a frequency equal to that of v.c.o. 30. The oscillator 36 has associated therewith circuitry 42 having a control input. When a proper input signal is applied to the control input of circuit 42, the frequency of the oscillator 36 is lowered by approximately 4 kHz. from its nominal value. The circuitry for achieving this frequency shift may simply be a switching diode for alternately including or excluding a small amount of capacitance from the circuit of the oscillator 36. The percentage change in the frequency of operation of oscillator 36 is so small that the stability gained by using crystal control of this oscillator will not be lost.

The output of mixer 38 and the tracking inputs of v.c.o.'s 30 and 32 are used to form a phase-locked loop frequency controlling circuit to maintain the v.c.o.'s at the required operating frequency for reception of a signal at a desired frequency. The remainder of that phase-locked loop circuit will not be described in detail.

The output of mixer 38 is applied to the input of a stage 50 which is operative to produce at its output a signal having a frequency one-half of that of its input signal and may conveniently comprise a flip-flop. The output of stage 50 is coupled to the input of a twelve-stage, programmable, binary counter 52. Stage 50 and counter 52 are effectively used as a frequency divider with a variable divisor which produces at an output of counter 52 a signal at the frequency of the input to stage 50 divided by the divisor. The effective divisor of stage 50 and counter 52 is selected by loading a count into counter 52 through the application of appropriate control signals to twelve data inputs thereof which are labeled in FIG. 1 according to the binary values assigned thereto. Stage 50 and counter 52 are such that the effective divisor is equal to 8180 minus the sum of the binary values of the inputs to which a logic level 1 signal is applied. For example, if logic level 1 signals are applied to the data inputs 2, 8, 64, and 2048 of counter 52 and no others, the frequency of the output signal would be that of the input signal divided by 6058. The divisor of stage 50 and counter 52 may be set to any even integer between 2 and 8180. Throughout the remainder of the description of the receiver 2, a convention will be used wherein a logic level 1 is represented by a positive voltage and logic level 0 by a ground voltage.

The output of counter 52 is coupled to the first input of a frequency and phase comparator 54. A reference oscillator 56 is provided which is preferably crystal controlled and produces an output signal at a frequency of approximately 3.2 MHz. The output of oscillator 56 is coupled to a frequency divider 58 which produces at its output a signal having a frequency equal to one-thirty second of the frequency of the signal applied to the input thereof. The output of divider 58 is coupled to the input of a frequency divider 60. When a logic level 0 signal is applied to a control input of divider 60, it produces at its output a signal having a frequency equal to one-sixth of the frequency of the signal applied to the input thereof. When a logic level 1 signal is applied to the control input of divider 60, it produces at its output a signal having a frequency equal to one-fifth of the frequency of the signal applied to the input thereof. The output of divider 60 is coupled to the input of a frequency divider 62 which produces at its output a signal having a frequency equal to one-fourth of the frequency applied to the input thereof. The output of frequency divider 62 is coupled to a second input of frequency and phase comparator 54. Comparator 54 produces at an output a signal related to the frequency and phase difference between the signals applied to its two inputs. In particular, when the frequency of the signal at the first input is higher than that at the second input, the comparator output is at a relatively high voltage; when the signal at the first input is lower in frequency than that at the second input, the comparator output is at a relatively low voltage; and when the signals at the two inputs are at the same frequency and phase, the comparator output appears as an open circuit. The output of comparator 54 is coupled to an input of an integrating amplifier 64 which develops at its output a d.c. voltage representing an integral over time of the output signal of comparator 54. The output of integrating amplifier 64 is coupled to the tracking inputs of v.c.o.'s 30 and 32 and controls the frequency of operation thereof.

As will be apparent, the frequency of the local oscillator signals and, thus, the frequency to which receiver 2 is tuned will be determined by circuitry controlling the operation of v.c.o.'s 30 and 32, tripler 34, circuit 42, counter 52 and divider 60. The apparatus for controlling the operation of those circuits will now be described in detail.

Squelch circuit 28 includes a second output which is such that when a radio frequency signal above the receiver squelch level is received, the output is at a circuit ground of the receiver 2, but when no such signal is received, the output is at a positive voltage. That output is coupled through a resistor 80 to the first contact of a four contact, three position switch 82 as shown. The second output of squelch circuit 28 is also coupled to the emitter of an NPN transistor 83 which has its base coupled to ground through a resistor 84 and its collector coupled both to ground through a capacitor 86 and to a first positive voltage supply V1 through a resistor 88. The collector of transistor 83 is coupled to the cathode of a diode 90 having its anode coupled through a resistor 92 to the first contact of switch 82. The second contact of that switch is coupled to the anode of a diode 93, which anode is also coupled to the third contact of switch 82 through the series combination of a resistor 94 and a capacitor 96. The fourth contact of switch 82 is coupled to a second positive voltage supply V2 having a potential greater than that of first positive voltage supply V1. The cathode of diode 93 is coupled to the control input of an oscillator 98. That oscillator when enabled provides at its output a signal at approximately 20 Hz. and includes a relaxation oscillator circuit with a capacitor 100 forming the timing element. When a positive current of sufficient magnitude is applied to the control input of oscillator 98, oscillator 98 is enabled, but in the absence of such a current, oscillator 98 is disabled. The current applied to the control input is used as the charging current for capacitor 100. The output of oscillator 98 is applied to an input of a four stage, binary ripple counter 102. That counter has four binary outputs, Q1, Q2, Q3, and Q4, with Q1 being the least significant and Q4 the most significant, and a fifth output, Q4, which is merely output Q4 inverted. Counter 102 also has positive and negative supply terminals as indicated.

The Q1, Q2, and Q3 outputs are coupled to three inputs of a 4-line-to-10-line decoder 104. That decoder has positive and negative supply terminals as indicated and the fourth input thereof is coupled to the negative supply terminal. Only eight outputs of the decoder 104 are utilized. At any time, the voltage at each of those eight outputs is at approximately the voltage at the decoder positive supply terminal except for one of the outputs which is at approximately the voltage of the decoder negative supply terminal. The identity of the low output will alter with changes in the count represented by outputs Q1, Q2, and Q3 of counter 104. The first four outputs of decoder 104 are individually coupled to first inputs of four exclusive OR gates 106, 108, 110, and 112 which may advantageously be constructed together as a single integrated circuit having positive and negative supply terminals as indicated, the negative supply terminal being coupled to the negative supply terminal of decoder 104. The second four outputs of decoder 104 are individually coupled to first inputs of four exclusive OR gates, 114, 116, 118, and 120 which may also be advantageously constructed together as a single integrated circuit having positive and negative supply terminals as indicated, the negative supply terminal being coupled to the negative supply terminal of decoder 104. The second inputs of gates 106, 108, 110, 112, 114, 116, 118, and 120 are all coupled together to the anode of a diode 122 having its cathode coupled to first positive voltage supply V1. The output of gate 106 is coupled to the bases of both of a pair of NPN transistors 124 and 126 and the outputs of gates 108, 110, 112, 114, 116, 118, and 120 are similarly each connected to the bases of pairs of NPN transistors 128 and 130, 132 and 134, 136 and 138, 140 and 142, 144 and 146, 148 and 150, and 152 and 154, respectively. The output of each of gates 106-120 is also separately coupled to the gate positive supply terminals through a load resistor. The emitters of each of transistors 124, 128, 132, 136, 140, 144, 148, and 152 are coupled together and to the collector of an NPN transistor 156 while the emitters of each of transistors 126, 130, 134, 138, 142, 146, 150, and 154 are coupled together and to the collectors of an NPN transistor 158. The emitters of both of transistors 156 and 158 are coupled to the negative supply terminals of the exclusive OR gates. The bases of transistors 156 and 158 are coupled to the Q4 and Q4 outputs, respectively, of counter 102. The collector of each of transistors 124, 128, 132, 136, 140, 144, and 148 is coupled to the cathode of a zener diode 178 through resistors 162, 164, 166, 168, 170, 172, 174, and 176, respectively, and the collector of each of transistors 126, 130, 134, 136, 140, 144, 148, and 150 is coupled to the cathode of a zener diode 160 through resistors 180, 182, 184, 186, 888, 190, 192, and 194, respectively. The anodes of diodes 160 and 178 are both coupled to the first positive voltage supply V1.

The receiver 2 further includes a 256 bit, nonvolatile, MNOS memory 200. Memory 200 is arranged in a 16 by 16 array so that it has the capability of storing 16 separate words, each word being comprised of 16 bits. In the drawing, the memory word lines or inputs are labeled 1-16 with one word corresponding to each channel of receiver 2. The memory bit lines or outputs are labeled Aux, U & T, H, ΔF, 2, 4, 8, 16, 32, 64, 128, 256, 512, 1024, 2048, and 4096 for reasons which will subsequently become apparent. The memory includes positive and reference supply terminals coupled to the first positive voltage supply V1 and circuit ground respectively, a negative supply terminal, and a write enable terminal W. For normal operation of the memory 200 wherein information is only read therefrom, the negative supply terminal is maintained at approximately the potential of a negative voltage supply V3. The memory further includes two terminals φ1 and φ2, which must be properly triggered to read out the information stored therein. The memory includes sense amplifiers for sensing the information contained in the selected memory words. A positive going pulse at input φ1 is required to enable the sense amplifiers and a second positive going pulse at input φ2 commencing after and overlapping that at input φ1 is required for the amplifiers to sense the information stored in the memory for the selected word. Following the application of the positive pulse to input φ2, the information stored in the selected word of the memory appears at the memory outputs. Counter 102 is constructed to include two outputs φ1 and φ2 at which are generated positive going pulses in the required sequence immediately following a change in the state of the counter 104. These outputs, of course, are coupled to the corresponding terminals on memory 200. The word inputs of memory 200 are normally maintained at the voltage of the memory positive supply, while the word line corresponding to the selected word is maintained at the memory reference voltage.

The collectors of transistors 124, 128, 132, 136, 140, 144, 148, 152, 126, 130, 134, 138, 142, 146, 150, and 154 are coupled to word lines 1-16 of memory 200, respectively. Each of those word lines are also individually coupled through a diode to a first contact of a first pair of contacts on a two position switch 202, 204, 206, 208, 210, 212, 214, 216, 218, 220, 222, 224, 226, 228, 230, and 232, respectively. Those diodes are oriented for high positive current conductivity toward the associated memory line. The memory word lines are further each individually coupled through the series combination of a diode and a light-emitting diode to the emitter of an NPN transistor 234. Those diodes and light-emitting diodes are oriented for high positive current conductivity toward the associated memory line. The second contacts of the first pairs of contacts of each of switches 202-232 are coupled together to the second contact of a first set of contacts on a double pole, double throw switch 236. The first contact of that set of contacts is coupled both to first positive voltage supply V1 through a resistor 238 and to the base of transistor 234. The collector of that transistor is coupled to the first positive voltage supply V1 through a resistor 240 and to the anode of a diode 242 having its cathode coupled through a resistor 244 to the control input of oscillator 98.

Output bit lines 2-4096 of memory 200 are individually coupled through resistors 250, 252, 254, 256, 258, 260, 262, 264, 266, 268, 270, and 272 to the corresponding data inputs of programmable counter 52. Output ΔF of memory 200 is coupled to the control input of circuit 42. Output H of that memory is coupled through a logic inverter circuit 280 to a first input of a two input OR gate 282. Output U & T of memory 200 is coupled through a logic inverter circuit 284 to the second input of OR gate 282. The output of OR gate 282 is coupled to the control inputs of v.c.o. 32 and oscillator 36 and through a logic inverter circuit 285 to the control inputs of v.c.o. 30. The output of inverter 280 is coupled to the gain control input of L and H band mixer 14 and the band control input of L and H band r.f. amplifier 12 and the first input of a two input OR gate 286 having its output coupled to the control input of antenna loading circuit 6. The output of inverter 284 is additionally coupled to the control inputs of frequency divider 60, U and T band r.f. amplifier 16, U and T band mixer 18, and tripler 34 and to the second input of OR gate 286. Further, the output of inverter 284 is coupled through another inverter 288 to the control input of L and H band r.f. amplifier 12 for enabling and disabling the operation thereof.

The output of integrator 64 is coupled to the tracking inputs of the U and T band r.f. amplifier 16 and tripler 34 and through an isolation resistor 290 to the tracking input of L and H band r.f. amplifier 12. The tracking input of that amplifier is coupled through the series combination of a variable resistor 292 and a fixed resistor 294 to the collector of a PNP transistor 296. The emitter of that transistor is coupled to a fourth positive voltage supply V4. The potential of fourth positive voltage supply V4 is intermediate the potentials of first and second positive voltage supplies V1 and V2. The base of transistor 296 is coupled first to the emitter thereof through a resistor 300 and to the H output of memory 200 through a resistor 302. The tracking input of L and H band r.f. amplifier 12 is also coupled to the collector of an NPN transistor 304 having its base coupled to ground through the series combination of a diode 308 and a resistor 310, diode 308 being oriented for high positive conductivity toward ground, and through the series combination of a resistor 312 and variable resistor 314 to the output of inverter 285.

The circuitry required for reception of signals at frequencies for which the correct information has been stored in memory 200 has thus far been described and its operation will now be explained. For the purposes of this explanation, it should be temporarily assumed that the negative supply terminals of decoder 104 and gates 106-120 and the emitters of transistors 156 and 158 are connected to the receiver circuit ground. When receiver 2 is being used to receive signals, the switches 202-232 are used as channel lockout switches, each switch corresponding to one word of memory in memory 200 and, thus, to one channel of reception of the receiver 2. When a switch is in the upper position as shown in FIG. 1, the corresponding channel is locked out so even if a signal is present on the frequency corresponding to that channel, it will not be received by receiver 2. When the switch is in the lower position so that there is no connection between the contacts of the first pair of contacts, the corresponding channel is activated and when the receiver scans to that channel, the receiver will stop on that channel if there is a signal above the receiver squelch level thereon and that signal will be received.

When receiver 2 is not tuned to a radio frequency signal above the squelch level, as previously mentioned, the output of squelch circuit 28 is at a positive voltage. With switch 82 in the position shown in FIG. 1 with the first and second contacts thereof connected together, that positive voltage is applied through diode 93 to the control input of oscillator 98 enabling the operation thereof. The outputs of counter 102 successively cycle through the states corresponding to counts of 0-15 as long as oscillator 98 is enabled. The three least significant bits are decoded by decoder 104 so that at any one time only one output is at logic level 0 and the others are at logic level 1, thus the first input of only one of exclusive OR gates 106-120 is at logic level 0. The second inputs of all the exclusive OR gates 106-120 are all at logic level 1 because of their connection through diode 122 to first positive voltage supply V1. Thus, at any one time only one output of one of the exclusive OR gates is at logic level 1, and, further, at any one time a positive voltage is applied to the bases of only one pair of the transistor pairs 124 and 126, 128 and 130, 132 and 134, 136 and 138, 140 and 142, 144 and 146, 148 and 150, and 152 and 154 so that a forward bias is applied to the base-emitter junctions of only that pair. The emitter-collector circuits of one of the transistors in each pair may be coupled to circuit ground through the emitter-collector circuit of transistor 156 while the emitter-collector circuits of the other transistor in each pair may be coupled to ground through the emitter-collector circuit of transistor 158. The bases of transistors 156 and 158 are coupled to outputs Q4 and Q4 of counter 102, respectively, so that the emitter-collector circuits thereof are conductive only during alternate time periods, i.e. when counter 102 is in the states corresponding to counts 0-7, the emitter-collector circuit of transistor 156 is conductive while when counter 102 is in the states corresponding to counts 8-15, the emitter-collector circuit of transistor 158 is conductive. Thus, when oscillator 98 is in a state corresponding to count 0, the emitter-collector circuits of transistors 124 and 156 are both conductive and word line 1 of memory 200 is coupled therethrough to ground, but none of transistors 128, 132, 136, 140, 144, 148, and 152 is conductive so that none of word lines 2-8 is similarly coupled to ground and transistor 158 is also not conductive so none of word lines 9-16 is coupled to ground. Instead, word lines 2-16 are maintained at the potential of first positive voltage supply V1 through their respective connections to that supply through resistors 164-192 and diode 178. Thus, word 1 is selected. When counter 102 is in the state corresponding to count 1, word line 2 of memory 200 is coupled to ground through transistors 128 and 156 and the remaining word line inputs are maintained at the potential of first positive voltage supply V1, thus selecting word 2 of the memory. Words 3-16 of memory 200 are similarly selected as the state of counter 102 is altered to successive values by the operation of oscillator 98. It should be noted that a connection to ground of one of the word input lines similarly couples the cathode of the corresponding light-emitting diode associated therewith to ground so that a positive current may flow therethrough from the emitter-collector circuit of transistor 234, thus giving a visual indication to the user of the channel to which the receiver is tuned at any instant.

For operation of receiver 2 in the L band, logic level 1 signals are supplied at output H and output U & T of memory 200. The logic level 1 signal at output H is applied through inverter 280 as a logic level 0 signal to the gain control input of L and H band mixer 14 to make the gain of mixer 14 relatively low and to the band control input of L and H band r.f. amplifier 12 to make that amplifier operative on the L band. The logic level 1 signal at the U & T output of memory 200 is applied through inverter 284 as a logic level 0 signal to the control inputs of U and T band r.f. amplifier 16, U and T band mixer 18, and tripler 34 to disable the operation of each of those circuits. Since logic level 0 signals are present at the outputs of both inverters 280 and 284 and, thus, at both inputs of OR gate 282, a logic level 0 signal is applied to the control inputs of v.c.o. 32 and oscillator 36 disabling the operation thereof and a logic level 1 signal from inverter 285 is applied to the control input of v.c.o. 30 enabling the operation thereof. The logic level 0 signals present at both inputs of OR gate 286 cause a logic level 0 signal to be applied to the control input of antenna loading circuit 6 so that antenna 4 is tuned to receive relatively low frequency signals in the L band. The logic level 0 signal at the output of inverter 284 is again inverted by inverter 288 so that a logic level 1 signal is applied to the control input of L and H band r.f. amplifier 12 enabling the operation thereof. The logic level 0 signal at the output of inverter 284 is effective to condition divider 60 so that it will divide by 5.

With divider 60 in the divide by five configuration, the 3.2 MHz. output of oscillator 56 is divided down to 5 kHz. and the second input to comparator 54 is at that frequency. Stage 50 and counter 52 are capable of division by any even integer between 2 and 8180. Thus, the circuitry shown is capable of controlling the operation of v.c.o. 30 between 10 kHz. and 40.90 MHz. in 10 kHz. intervals at integral multiples of 10 kHz. Since the L band covers the frequency range of approximately 30-50 MHz. and the assigned frequencies are at even multiples of 20 kHz., with a 10.8 MHz. intermediate frequency the v.c.o 30 may operate over the range of 19.2-39.2 MHz. at integral multiples of 20 kHz. to be capable of operation at all frequencies in the L band. The circuitry provided has that capability.

For operation of receiver 2 in the H band, a logic level 0 signal is supplied at the H output of memory 200 and a logic level 1 signal is supplied at the U & T output. In this condition, logic level 1 signals are applied to the gain control input of L and H band mixer 14, increasing the relative gain of that stage, to the band control input of L and H band r.f. amplifier 12, making that stage operative on the L band, and to an input of OR gate 286 causing antenna loading circuit 6 to tune antenna 4 so that it is responsive to relatively high frequency signals. The increase in gain of the mixer 14 when it is operative on the H band over that used on the L band is to compensate for the reduction in gain in the r.f. amplifier 12 with higher frequency signals. The logic level 1 output of inverter 280 is also effective through OR gate 282 to enable the operation of both oscillator 36 and v.c.o. 32 and disable the operation of v.c.o. 30. L and H band r.f. amplifier and mixer 12 and 14 are enabled, U and T band r.f. amplifier and mixer 16 and 18 and tripler 34 are disabled and divider 60 is set to divide by 5, all as described with reference to operation in the L band. The output of v.c.o. 32 is reduced by 133 MHz. by operation of oscillator 36 and mixer 38 before it is applied to the input of frequency divider 50. Thus, the circuitry shown is capable of controlling the operation of v.c.o. 32 between 133.01 MHz. and 173.90 MHz. at integral multiples of 10 kHz. Since the H band covers the frequency range of approximately 150-173 MHz., with a 10.8 MHz. intermediate frequency, the v.c.o. 32 may operate over the range of approximately 139.2-162.2 MHz. to be capable of providing coverage over the entire H band for the receiver 2. The circuitry disclosed provides this range of operation.

However, as thus far discussed, the output of v.c.o. 32 is in integral multiples of 10 kHz. Some of the assigned frequencies in the H band are not at integral multiples of 10 kHz. but, instead, fall midway therebetween at integral multiples of 5 kHz. The ΔF output of memory 200 is at logic level 0 and circuit 42 is disabled when the receiver is tuned to a signal in the H band at an integral multiple of 10 kHz. When the receiver is tuned to a signal in the H band not at an integral of 10 kHz., outputs 2-4096 of memory 200 are set so that v.c.o. 32 will operate at a frequency corresponding to the integral multiple of 10 kHz. immediately above the desired frequency. The ΔF output of memory 200 is placed at logic level 1 and circuit 42 is thereby enabled lowering the frequency of operation of oscillator 36 by 4 kHz. and, thus, similarly lowering the frequency of v.c.o. 32 by 4 kHz. to approximately the frequency desired. I.F. amplifier 20 has a sufficiently broad bandwidth that a 1 kHz. error in the local oscillator frequency does not degrade the receiver performance below an acceptable level.

For operation of the receiver 2 in the U and T bands, a logic level 1 signal is present at output H of memory 200 and a logic level 0 signal is present at the U and T output. In this condition, the output of OR gate 282 is effective to enable both oscillator 36 and v.c.o. 32 and disable v.c.o. 32; the output of inverter 284 is effective to enable U and T band r.f. amplifier and mixer 16 and 18 and tripler 34, through OR gate 286 to cause antenna loading circuit 6 to tune antenna 4 to receive relatively high frequency signals, and to cause divider 60 to be set to divide by 6; and the output of inverter 288 is effective to disable L and H band r.f. amplifier 12. With the divider 60 set to divide by 6, the signal applied to the second input of comparator 54 is at 4.17 kHz. Therefore, the frequency of operation of v.c.o. 32 may be controlled between 133.00833 MHz. and 167.008333 MHz. at even integral multiples of 4.167 kHz. The output of tripler 34 is used as the local oscillator signal during reception on the U and T bands. The frequency of the output thereof may be controlled by the circuitry shown between 399.025 MHz. and 501.250 MHz. at even integral multiples of 12.5 kHz. Since the U and T bands cover the frequency range of approximately 453-512 MHz., with a 10.8 MHz. intermediate frequency, a local oscillator frequency which varies over the range of approximately 442.8-501.2 MHz. is required. The circuitry shown provides this range of operation. The outputs of tripler 34 occur at even integral multiples of 12.5 kHz., i.e., at integral multiples of 25 kHz. As mentioned, in the U band, the designated frequencies occur at integral multiples of 25 kHz. so that the circuitry as thus far described provides local oscillator signals at the correct frequencies. However, in the T band the designated frequencies appear at frequencies displaced from an integral multiple of 25 kHz. by 12.5 kHz. For frequencies in the T band, outputs 2-4096 of memory 200 are set to permit reception at the integral of 25 kHz. immediately above the desired frequency and circuit 42 is enabled lowering the frequency of oscillator 36 by 4 kHz. and thus lowering the frequency of the output of tripler 34 by 12 kHz. I.F. amplifier 20 has a sufficiently broad bandwidth that the resultant 0.5 kHz. error in the local oscillator frequency does not degrade the receiver performance below an acceptable level.

The circuitry of receiver 2 causes oscillator 98 to remain operative until the receiver is tuned to a signal above the receiver squelch level. When the receiver is tuned to such a signal with switch 82 in the upper position as shown in FIG. 1 connecting the first and second contacts thereof together, the output of squelch circuit 98 falls to the receiver ground level and the operation of the oscillator 98 is disabled until the received signal terminates. Thus, the receiver remains tuned to that signal until it terminates, at which time oscillator 98 is again enabled and the receiver again commences scanning from channel to channel until it is again tuned to a signal above the squelch level. This mode of operation of receiver 2 is referred to as the scanning mode. If it is desired to disable the scanning operation and place the receiver in a manual mode, switch 82 may be moved to the middle position so that the second and third contacts thereof are connected together. No positive voltage is then applied to the input of oscillator 98 so that its operation is disabled. In order to alter the channel to which the receiver 2 is tuned, switch 82 is then placed in the lower position so that the third and fourth contacts thereof are connected together. The network of resistor 94 and capacitor 96 is then coupled to the second positive voltage supply V2 and a positive current pulse is applied to the control input of oscillator 98 to enable the operation thereof. The component values of resistor 94 and capacitor 96 are chosen so that oscillator 98 is only operative for a long enough period to emit one pulse to counter 102. Thus, the receiver is advanced one channel each time switch 82 is moved from the middle to the lower position. Switch 82 is preferably spring loaded out of the lower position.

In some instances, when receiver 2 is in the scanning mode on certain selected channels it is desired to prevent the receiver from scanning to a different channel for a short time after the termination of a signal on that channel. This occurs particularly on channels wherein two-way communications are conducted and it is desired to listen to both sides of the conversation. Often there are short intervals of time between the cessation of a signal by one party to the communication and the commencement of a signal by the other party. In the absence of a short delay in the recommencement of the scanning operation, the receiver would start scanning to another channel prior to commencement of the reply signal.

For channels on which it is desired to include a short delay in the commencement of the scanning operation, memory 200 is programmed to provide a logic level 1 signal at the AUX output thereof. That logic level 1 signal is applied as a positive voltage to the base of transistor 83. When the second output of squelch circuit 28 is at ground level 1 indicating the receipt of a signal on the channel to which the receiver is tuned, the emitter-base junction of transistor 83 is forward biased and capacitor 86 is discharged to ground through the emitter-collector circuit thereof. When the second output of the squelch circuit goes to a positive voltage, the emitter-base junction of transistor 83 is then reverse biased and its emitter-collector circuit is made nonconductive. However, capacitor 86 is effectively placed in parallel with timing capacitor 100 of oscillator 98, thus temporarily lowering the frequency thereof. In some embodiments of this invention, it may be desired to use the AUX output of memory 200 to provide auxiliary functions other than the scan delay feature disclosed.

As was previously mentioned, switches 202-232 may be used to lock out selected channels so that even if a signal above the receiver squelch level is present on that channel, the receiver will not stop the scanning operation thereon. This operation is provided by insuring that a positive voltage is applied to the control input of oscillator 98 when the receiver is tuned to the channel or channels to be locked out. In order to lock out a particular channel, its corresponding one of switches 200-232 is placed in the upper position as shown in the figure. The emitter-collector circuit of transistor 234 is normally conductive because of the forward bias applied to the base-emitter junction of that transistor from first positive voltage supply V1 through resistor 238 and the connection of the emitter of that transistor to ground through the light-emitting diode of the selected channel and the corresponding one of transistors 124-154. When transistor 234 is conducting, no current from positive voltage supply V1 is applied through resistor 240 to the control input of oscillator 98. However, when the receiver is tuned to a channel which has been locked out by placing the corresponding one of switches 202-232 in the upper position, the base of transistor 234 is coupled to ground through the circuit of switch 236 and the corresponding one of switches 202-232, thus, the emitter-collector circuit of transistor 234 is nonconductive and a positive voltage is applied from first positive voltage supply V1 through resistors 240 and 244 and diode 242 to the control input of oscillator 98. The presence of that voltage insures that the oscillator will remain in operation and the receiver will not stay tuned to the selected channel even if a signal above the receiver squelch level is received. The resistance of the series combination of resistors 240 and 244 is preferably relatively small compared to the resistance of resistor 80 so that the receiver will stay tuned to a locked out channel for only a very short period of time.

As discussed, the output of integrator 64 is used to control the operating frequencies of v.c.o.'s 30 and 32. It is also used as a tracking signal to tune the frequency responsive circuits of U and T band r.f. amplifier and mixer 16 and 18, tripler 34, and L and H band r.f. amplifier 12. In receiver 2, the same signal may be used to tune both v.c.o.'s 30 and 32, U and T band r.f. amplifier and mixer 16 and 18, and tripler 34. However, it is not always possible to design all of the tuned circuits of a receiver so that a single tracking signal can be used to track each of the tuned circuits in the appropriate manner. With reference to FIG. 2 of the drawing there is shown a set of graphs representing the tracking signals in volts on the ordinate as a function of the frequency of the input signal to frequency divider 50 on the abscissa. The plot 320 represents the output of integrator circuit 64 when receiver 2 is tuned to the H, U, or T bands. As mentioned, that signal is used to control the frequency of operation of v.c.o. 32 and in one receiver as disclosed in FIG. 2 the U and T band r.f. amplifier and mixer 16 and 18 and tripler 34 were such that the same signal could be used as the tracking signal on the U and T bands. However, that same receiver required a tracking signal which varied in the manner as shown at 322 in order to properly track the tuned circuits of L and H band r.f. amplifier 12 when the receiver was tuned to the H band. Also shown in FIG. 2 at 324 is a plot representing the output of integrator circuit 64 when receiver 2 is tuned to the L band. The receiver mentioned required a tracking signal as shown at 326 to properly track the L and H band r.f. amplifier 12 when the receiver is tuned to a channel in the L band.

Transistor 296 and its associated components is effective when the receiver is tuned to a channel in the H band to alter the signal present at the output integrator circuit 64 shown at 320 to the signal shown at 322 prior to the application thereof to the tracking control input of L and H band r.f. amplifier 12. When receiver 2 is tuned to a channel in the L, U, or T bands, the H output of memory 200 is at logic level 1 so a reverse bias is applied to the base-emitter junction of transistor 296. The emitter-collector circuit thereof is thus essentially nonconductive and the transistor and its associated components have no effect on the tracking signal applied to L and H band r.f. amplifier 12. When receiver 2 is tuned to a channel in the H band, the H output of memory 200 is at logic level 0, thus forward biasing the base-emitter junction of transistor 296 and making the emitter-collector circuit thereof highly conductive. In this state, a voltage divider is formed comprising resistor 290, variable resistor 292, and resistor 294 which is connected between the output of integrator circuit 64 and the fourth positive voltage supply V4. When the output of integrator circuit 64 is equal to the potential at the emitter of transistor 296, the potential at the junction of resistors 290 and 292 is equal to the output of integrator circuit 64. As the output of integrator circuit 64 falls below the potential at the emitter of transistor 296, the potential at the junction of resistors 290 and 292 also falls but at a slower rate than the output of integrator circuit 64. The potential at that junction exceeds the potential at the integrator circuit output by an amount proportional to the difference between the first potential at the emitter of transistor 296 and the integrator circuit output potential, the constant of proportionality being determined by the relative circuit values of resistors 290 and 294 and variable resistor 292. Variable resistor 292, of course, permits convenient alteration of the constant of proportionality. This manner of variation is just that desired as shown at 322.

Transistor 304 and its associated components are effective when receiver 2 is tuned to a channel in the L band to alter the signal present at the output of integrator circuit 64 shown at 324 to the signal shown at 326 prior to the application thereof to the tracking control input of L and H band r.f. amplifier 12. When the receiver is tuned to a frequency in the H, U, or T bands, the output of inverter 285 is at logic level 0 and, thus, no forward bias is applied to the base-emitter junction of transistor 304, the emitter-collector circuit of that transistor is essentially nonconductive, and that transistor and its associated components have no effect on the tracking signal applied to L and H band r.f. amplifier 12. When receiver 2 is tuned to a channel in the L band, the output of inverter 285 is at logic level 1 and the base-emitter junction of transistor 304 is forward biased. In this condition, transistor 304 and its associated components are used as a fixed current sink which serves to draw positive current away from the tracking input to r.f. amplifier 12. Thus, the potential at that tracking input is reduced below the potential at the output of integrator 64 by a fixed amount equal to the resistance of resistor 290 times the current flow through the emitter-collector circuit of transistor 304. Thus, the tracking voltage applied to r.f. amplifier 12 is altered to that shown at 326.

The circuitry required to program memory 200 will now be described. The memory is such that the information stored therein may be altered one word at a time. The stored information is first erased and then the desired information is written in. The erase process is performed by applying a pulse of relatively high positive voltage with respect to the memory reference supply terminal to the word line corresponding to the word to be erased. (This should be contrasted to the operation of the memory in the read mode wherein the selected word line is at a relatively low voltage with respect to the other word lines.) The positive pulse serves to set each of the memory elements of the selected word to zero. The application of the positive high voltage pulse to a word input may well result in a potential difference between the selected word line and the memory negative supply terminal which is sufficient to damage the memory. Thus, it is also necessary to disconnect the negative supply terminal from voltage supply V3 when the erase operation is being performed. In order to read the desired information into the memory, a negative voltage pulse must be applied to both the desired word line and to the write input W of memory 200. The memory will be programmed for logic level 1 signals for bits that have their corresponding bit lines coupled to ground during the application of a negative pulse to input W and will be programmed for logic level 0 signals for bits that have their corresponding bit lines open circuited during the application of a negative pulse to input W.

The programming circuitry includes two switches, double pole double throw switch 236 as previously described and a single pole double throw switch 330. Switches 236 and 330 are in the upper positions as shown in FIG. 1 for normal operation of the receiver. Switch 236 is placed in its lower position to enable the circuitry required to write new information into a selected word of memory 200. The information to be read into the memory is programmed through the use of switches 202-232. In order to perform the actual writing operation, switch 330 is then momentarily placed in its lower position. Switch 330 may be spring loaded away from its lower position so that it will return to the upper position after the new information is read into the memory.

The negative supply terminals of each of counter 102, four-to-ten-line decoder 104, and exclusive OR gates 106-120 are coupled to a negative supply line 332. The positive supply terminals of each of exclusive OR gates 106-120 and the four-to-ten-line decoder 104 are coupled to a positive supply line 334. Line 332 is coupled through a diode 338 to the collector of an NPN transistor 340. The collector of that transistor is additionally coupled to the first or uppermost contact of a second set of contacts of switch 236 while the emitter of that transistor is coupled to ground. The base of transistor 340 is coupled to line 334 through a resistor 342 to a fifth positive voltage supply V5 through a resistor 344, and to the third or lowermost contact of switch 330 through a capacitor 346. Positive voltage supply V5 is at a potential intermediate the potentials of the first and fourth voltage supplies V1 and V4. The collector of transistor 340 is also coupled to ground through the series combination of two resistors, 348 and 350, the junction of which is coupled to the base of an NPN transistor 352. The emitter of transistor 352 is coupled to ground while the collector thereof is also coupled to the third contact of switch 330. The first and second contacts of that switch are both coupled to ground through a resistor 354 and a capacitor 356, respectively. The second contact of the second set of contacts of switch 236 is coupled to ground while the third contact thereof is coupled to a sixth positive voltage supply V6 through the series combination of a light-emitting diode 358 and a resistor 360, the light-emitting diode 358 being poled for high positive conductivity away from the sixth positive voltage supply V6. The sixth positive voltage supply is further coupled through the series combination of a diode 362 and a resistor 364 to the collector of transistor 352, diode 362 being oriented for high positive conductivity away from the sixth positive voltage supply V6. The potential of the sixth positive voltage supply is less than that of the first positive voltage supply V1.

The line 332 is further coupled to the collector of an NPN transistor 366. The base of transistor 366 is coupled to the collector of an NPN transistor 368 and to ground through a resistor 370. The emitters of both of transistors 366 and 368 are coupled to the negative voltage supply V3. The base of transistor 368 is coupled to ground through a resistor 372 and to the collector of transistor 340 through the series combination of a resistor 374 and a capacitor 376. One contact of the second pair of contacts of each of switches 202-232 is coupled through a diode to a corresponding bit line AUX-4096 of memory 200, respectively, as shown, the diodes being oriented for high positive conductivity away from the bit lines. The second contact of each of those contact pairs is coupled to the emitter of a PNP transistor 380. The collector of that transistor is coupled both directly to ground and to the emitter thereof through a capacitor 382. The base of transistor 380 is coupled to the write input W of memory 200 and through resistor 384 to the positive supply terminal of counter 102. That positive supply terminal is also coupled both through a resistor 386 to the base of transistor 156 and through a resistor 388 to the base of transistor 158. A capacitor is provided between the positive and negative supply terminals of counter 102.

The line 332 is coupled to the emitters of transistors 156 and 158 while line 334 is coupled to the collectors thereof through resistors 390 and 392, respectively. The collector of transistor 156 is coupled through a resistor 394 to the base of an NPN transistor 396 having its emitter coupled to line 332 and its collector coupled to second positive voltage supply V2 through resistor 398 and to the anode of a diode 400 having its cathode coupled to the cathode of zener diode 178. The collector of transistor 158 is coupled through a resistor 402 to the base of an NPN transistor 404 having its emitter coupled to line 332 and its collector coupled to second positive voltage supply V2 through a resistor 406 and to the anode of a diode 408 having its cathode coupled to the cathode of zener diode 160. The line 332 is coupled to the anode of a diode having its cathode coupled to first positive voltage supply V1.

Circuitry is provided for supplying power to the logic circuitry described. It includes an NPN transistor 410 having its emitter coupled to the line 334 and its collector coupled to the fifth positive voltage supply V5. The base of that transistor is coupled to the collector thereof through a resistor 412 and to the cathode of a zener diode 414 having its anode coupled to line 332. The breakdown voltage of zener diode 414 is approximately equal to the voltage required to power the decoder 104 and the exclusive OR gates 106–120 so that transistor 410 and its associated components serve to maintain a potential difference between the negative and positive supply lines 332 and 334 to power those elements. A diode 415 is included having its anode coupled to line 332 and its cathode coupled to first positive voltage supply V1. There is also provided a transistor 416 having its emitter coupled to the positive supply line of counter 102 and its collector coupled to the second positive voltage supply V2. The base of transistor 416 is coupled to the collector thereof through resistor 418 and to the cathode of a zener diode 420 having its anode coupled to line 332. The breakdown voltage of zener diode 420 is approximately equal to the voltage required to power the counter 102 so that transistor 416 and its associated components serve to maintain a potential difference between the positive and negative supply terminals of counter 102 to power that counter.

The operation of the programming circuitry as thus far described is as follows. During the normal operation of receiver 2, the connection of the base of transistor 340 to fifth positive voltage supply V5 through resistor 344 is effective to forward bias the emitter-base junction of transistor 340 so that line 332 is coupled to the receiver ground through diode 338 and the parallel circuit of the emitter-collector circuit of transistor 340 and the first two contacts of the second set of contacts of switch 236. The circuitry of transistors 410 and 416 supply the required operating potentials to counter 102, decoder 104, and exclusive OR gates 106 and 120 so that the receiver operates as previously described. To reprogram a channel, switch 236 is placed in its lower position. By putting switch 236 in that position, three things happen. First, the circuit between positive voltage supply V6 and ground through light-emitting diode 358 is completed, lighting that diode and giving the user a visual indication that the programming circuit is enabled. Second, the circuit from line 332 to ground through switch 236 is broken. Third, the circuit to the base of transistor 234 is broken so that the transistor 234 remains nonconductive no matter what channel the receiver is tuned to, even a locked out channel. The receiver is then advanced to the channel it is desired to change using switch 82 and switch 82 is placed in the center position shown so that the scanning operation of the receiver is disabled. Finally, to complete the programming operation write switch 330 is temporarily placed in its lower position. So operating switch 330 causes a ground level voltage pulse to be applied through capacitors 356 and 346 to the base of transistor 340 removing the forward bias from the base-emitter junction of that transistor and causing the emitter-collector circuit to become nonconductive. The connection of line 332 to the receiver circuit ground is thus broken and the potential of that line rises toward the potential of the fifth positive voltage supply V5 present at the collector of transistor 410. However, that potential rise is limited by diode 415 so that the potential of line 332 is then fixed at the potential of first positive voltage supply V1. Transistors 410 and 416 and their associated components continue to provide operating voltage to counter 102, decoder 104, and exclusive OR gates 106–120. Transistors 340 and 352 combine to operate as a single-shot circuit. When transistor 340 is made nonconductive by actuation of switch 330 as described, a forward bias is supplied to the base-emitter junction of transistor 352 making the emitter-collector circuit thereof conductive and placing the collector of transistor 352 at ground potential. Thus transistor 340 will remain nonconductive for a period of time depending on the rate of charging of capacitor 346 even if switch 330 is returned to its upper position before the expiration of that period.

With transistor 340 nonconductive, the negative supply terminals of decoder 104 and exclusive OR gates 106–120 are at the potential of the first positive voltage supply V1, as described. The second input of each of those gates 106–120 is tied to the first positive voltage supply V1 through diode 122, so that what now appears to those gates as a logic level 0 signal is applied to those inputs. As stated, the output of decoder 104 corresponding to the selected channel is at the potential of the decoder negative supply terminal while the remaining outputs are at the potential of the decoder positive supply terminal, so the decoder output corresponding to the selected channel appears as a logic level 0 to gates 106–120. Thus, the output of one of the gates 106–120 corresponding to the channel to which the receiver is tuned will be at logic level 0 of the gates, the potential on line 332, and the outputs of the remaining gates will be at logic level 1, the potential on line 334, so that the potential on the bases of seven of the pairs of transistors 124 and 126, 128 and 130, 132 and 134, 136 and 138, 140 and 142, 144 and 146, 148 and 150, 152 and 154, will be positive with respect to the potential at the negative supply line 332 and the bases of the transistors in the remaining pair will be at the potential of negative supply line 332. Thus, the transistors of only one of those pairs will be nonconductive at any one time. This is to be contrasted with the situation where the receiver is used in its normal receiving mode wherein the pair including the transistor corresponding to the channel to which the receiver is tuned will be biased for conductivity.

As in the previously described operation of receiver 2, only one of transistors 156 and 158 will be conductive at any time. When transistor 156 is conductive, no forward bias is applied to the emitter-base circuit of transistor 396 so that its collector-emitter circuit is nonconductive. Thus, the potential of the second positive voltage supply V2 is present at the cathode of zener diode 178. That potential is applied through the one of resistors 162–176 to the one of word lines 1–8 of memory 200 which is not at the potential of line 332 because of the conduction of the corresponding one of transistors 124, 128, 132, 136, 140, 144, 148, and 152 and transistor 156. When transistor 156 is conductive, transistor 158 is nonconductive, forward biasing the emitter-base junction of transistor 404 through resistor 392 and making the emitter-collector circuit thereof conductive. Thus, the potential of the first positive voltage supply V1 is applied to each of word lines 9–16 of memory 200. That potential, however, is insufficient to cause the erasure of the information stored in memory 200 at those words. When transistor 156 is nonconductive and transistor 158 is conductive, the inverse situation applies; the potential of second positive voltage supply V2 appears at the cathode of zener diode 160 and that potential is applied through the one of resistors 178–192 to the corresponding one of word lines 9–16 which is not at the potential of line 332 and the potential of the first positive voltage supply V1 is supplied to each of word lines 1–8.

To take a single example for purposes of clarity, assume that the receiver is tuned to channel 6 in the normal receive mode with switch 236 in its upper position. In that case, the Q4 output of counter 102 is positive with respect to the potential on the negative supply line 332 so that transistor 156 is conductive and the first input of gate 116 is at the potential of line 332, the output of gate 116 is positive with respect to the potential on line 332, and transistor 144 is conductive. Thus, word line 6 of memory 200 is at the potential of line 332 which is at circuit ground because of the conduction of tansistor 340 and the connection through line 236. The remaining word lines are at the potential of first positive voltage supply V1. When switches 236 and 330 are placed in their lower positions, the operation of the logic circuitry is inverted. The Q4 output of counter 102 remains positive with respect to the potential on the negative supply line 332 so that transistor 156 is conductive. The output 6 of decoder 104 remains at the potential of line 332, but the output of gate 116 is now at the potential of line 332 so that transistors 144 and 146 are non-conductive. The other ones of transistors 124–154 are conductive. Thus, word lines 1–5, 7 and 8 are at the potential of line 332 because of their connection thereto through transistors 124, 128, 132, 136, 140, 148, and 150, respectively, and transistor 156, word lines 9–16 are held at the potential of first positive voltage supply V1, i.e., the potential of line 332, because of their connection therethrough zener diode 160, and word line 6 is at the potential of second positive voltage supply V2 because of its connection thereto through resistor 398, diode 400, and resistor 172. Thus, while transistor 340 is non-conductive, a positive voltage pulse at the potential of second positive voltage supply V2 is applied to word line 6 of memory 200 to erase the information stored in that memory at word 6.

After a period of time determined by the relative values of capacitor 346 and its associated resistors, transistor 340 will again become conductive tending to return line 332 to ground potential. The emitter-base junction of transistor 368 is normally biased on through the connection of the emitter thereof to the negative voltage supply V3 and the base thereof to ground through resistor 372. Thus, the emitter-collector circuit of transistor 368 is normally conductive preventing the application of any forward bias to the emitter-base circuit of transistor 366 so that the emitter-collector circuit thereof is nonconductive. However, when the potential on line 332 falls from that of the first positive voltage supply V1 toward ground when transistor 340 again becomes conductive, a negative going pulse is developed through capacitor 376 and resistor 374 which is applied to the base of transistor 368 making that transistor nonconductive and causing transistor 366 to become conductive. Thus, negative supply line 332 goes to the potential of the negative voltage supply V3. In this condition, decoder 104, exclusive OR gates 106–120, and transistors 124–154 function just as they do in the receive mode except that the selected memory word line which is coupled to the negative supply line 332 is coupled to a potential which is negative with respect to circuit ground instead of being at circuit ground. Thus, a negative potential is applied to the selected word line as is required to permit information to be written into that word. When the potential of line 332 falls to that of the negative voltage supply V3, the potential at the emitter of transistor 416 falls an equal amount to a potential below ground. Thus, a negative potential is applied to the write input W of memory 200, enabling the memory write function. Further, that negative potential also forward biases the base-emitter junction of transistor 380 causing the emitter-collector circuit thereof to be conductive and placing the emitter of that transistor at ground potential. Each of the memory bit lines for which the corresponding one of switches 202–232 is in the lower position coupling the second set of contacts together will be coupled to ground. For each of those bit lines, a 1 will be written into the corresponding bit of the selected word. The other bits will remain at 0.

As was previously mentioned, during the erase process it is desirable to remove the supply potential from the negative supply terminal of memory 200. The circuit provided to perform this function includes an NPN transistor 422 having its base coupled through a resistor 424 to the collector of transistor 340, its emitter coupled to the sixth positive voltage supply V6, and its collector coupled through a resistor 426 to the base of an NPN transistor 428. The emitter of the latter transistor is coupled to the base thereof through a resistor 430 and to the negative voltage supply V3 while the emitter thereof is connected to the negative supply terminal of memory 200. When transistor 340 is conductive, a forward bias is applied to the base-emitter junction of transistor 422 so that the emitter-collector circuit thereof is conductive. A forward bias is thus also applied to the emitter-base junction of transistor 428 making the emitter-collector circuit thereof conductive and connecting the negative supply terminal of memory 200 to the negative voltage supply V3. When transistor 340 becomes nonconductive and the potential on line 332 rises to the potential of the first positive voltage supply V1, transistor 422 becomes nonconductive thus terminating the bias current to transistor 428 and making that transistor nonconductive, removing the negative potential from the negative supply terminal of the memory.

Further circuitry is provided in receiver 2 for eliminating the possibility of unintentionally erasing information stored in the memory during the presence of transient conditions which might occur in the receiver. These conditions occur particularly when power is applied to or removed from the circuits. If the relative time constants associated with the various power supplies were such that the second positive voltage supply V2 was at its operating voltage at a time when the lower voltage supplies were not, a condition could well arise where the potential of the second positive voltage supply V2 would be applied to one of the word lines of memory 200 thus erasing the information stored in the memory at the corresponding word. In order to prevent that occurrence, an NPN transistor 432 is provided having its base coupled to line 332, its emitter coupled through a resistor 434 to ground, and its collector coupled through a resistor 436 to second positive voltage supply V2 and through resistors 438 and 440 to the bases of transistors 396 and 404, respectively. The forward bias current supplied to transistors 396 and 404 from second positive voltage supply V2 through resistors 436, 438, and 440 insure that those transistors will be conductive, thus eliminating the possibility that the potential from second positive voltage supply V2 will be applied to the memory word lines, until the transistor 432 becomes conductive. The presence of the potential of second positive voltage supply V2 is effective to prevent itself from being applied to word lines of memory 200. In the normal operating condition of the receiver, when transistor 340 is conductive, transistor 432 is made nonconductive to prevent the application of the potential of the second positive supply to the memory word lines. When transistor 340 is conductive, transistor 432 is made conductive by the rise in potential of line 332, thus removing the effect of transistor 432 from the operation of transistors 396 and 404.

A further potential for unintentional erasure of information stored in memory 200 exists when switch 236 is in the lower position and power to the receiver is terminated; if the potential supplied by sixth positive voltage supply V6 fell rapidly with respect to the potential of the other voltage supplies, a negative going pulse could be applied to the base of transistor 34, causing erasure of the memory information corresponding to the channel to which the receiver was tuned. Diode 362 is provided to prevent this possibility.

Finally, as mentioned, memory 200 requires pulses at inputs $\phi 1$ and $\phi 2$ in order to transfer the information from the selected word to the output or bit lines. If the automatic scanning circuitry were disabled, when power was initially applied to the receiver, there would be no mechanism for providing those pulses. The light-emitting diodes associated with switches 202-232 would indicate to the user that the receiver was tuned to a particular channel, but it would actually be tuned to an arbitrary frequency determined by the output of memory 200. In order to prevent this occurrence, circuitry is provided including a resistor 441 having one terminal coupled to the control input of oscillator 98 and a second terminal coupled both through a capacitor 442 to the fifth positive voltage supply V5 and to the cathode of a diode 444 having its anode coupled to ground. When power is supplied to the receiver and the fifth positive voltage supply V5 rises toward its operative value, capacitor 442 applies a positive voltage pulse to the control input of oscillator 98, thus insuring that the oscillator will go through at least one cycle of operation and the receiver will be tuned to one of the frequencies for which information is stored in memory 200.

Nonvolatile MNOS memories of the general type described above are available from Nitron Corp., Cupertino, Calif. Memories of that type and having the configuration described with reference to memory 200 are more specifically indentified as Part Number B-411 of Electra Company, Cumberland, Ind. In one receiver of FIG. 1, it has been found advantageous to construct oscillator 56, frequency dividers 58, 60, and 62, comparator 54, oscillator 98, and counter 102 as a single integrated circuit. That circuit is specifically identified as Part No. B-412 of Electra Company, Cumberland, Ind.

It will thus be seen that a radio receiver has been provided which fulfills each of the aforementioned objects and desiderata. In particular, the memory program circuit provided is exceedingly simple to use. Data is entered through the use of a spearate switch for each data bit. The switches used for data entry are the channel lockout switches. Channel lockout switches are common place on scanning radio receivers previously available, so users of such receivers are accustomed to the presence thereof. Potential users will, thus, not be overawed by the presence of a large number of new user controls in order to perform the memory programming function. The presence of the enable switch 236 requires the operator to go through a two step sequence of operations in order to erase information stored in the memory. This requirement significantly reduces the possibility of a user unintenionally erasing the portion of the memory through inadvertent depression of the write switch 330. Further, the receiver disclosed enables retention of the desirable feature found in prior receivers of scanning relatively rapidly past channels which have been locked out. Finally, circuitry has been provided for economically performing the complex functions required to program nonvolatile memories of the MNOS type. The provision of such economical program circuitry makes feasible the use of this highly desirable form of memory with its capability of retaining information with no applied power.

While a particular embodiment of this invention has been disclosed, it will be understood, of course, that the invention is not to be limited thereto. It will be obvious that many further modifications of the specific embodiment disclosed may be made which make use of this invention. It is contemplated, therefore, by the appended claims, to cover any such modifications as fall within the true spirit and scope of this invention.

We claim:

1. A scanning radio receiver tunable to a plurality of predetermined radio frequencies comprising:
    scanning means for sequentially selecting individual ones of said predetermined radio frequencies;
    means for tuning said scanning radio receiver to said sequentially selected predetermined radio frequencies to reproduce a signal present at said selected radio frequency;
    scanning control means coupled to said scanning means and responsive to the presence of said signal at said selected radio frequency for stopping said sequential selection and maintaining said receiver tuned to said selected radio frequency for the duration of said signal and for automatically continuing the sequential selection in response to termination of said signal;
    means for providing a rescan delay control signal associated with only certain preselected ones of said radio frequencies; and rescan delay means coupled to said scanning control means and responsive to said rescan delay control signal for automatically delaying said continuation of the sequential selection at only certain preselected ones of said radio frequencies while enabling said sequential selection to continue without delay at remaining ones of said radio frequencies.

2. The scanning radio receiver of claim 1 wherein said means for providing said rescan delay control signal comprises memory means for storing a plurality of binary valued logic signals individually associated with said predetermined radio frequencies, said binary valued logic signals associated with said only certain preselected ones of said radio frequencies having a first binary value, and said binary valued logic signals associated with said remaining ones of said radio frequencies having a second binary value.

3. The scanning radio receiver of claim 2 further comprising means coupled to said memory means for programming the binary value of said binary valued logic signals stored in said memory means.

4. In a multi-channel scanning radio receiver including scanning means for successively tuning to a plurality of predetermined radio frequency channels; means for detecting the presence of a signal on one of said tuned channels; means responsive to the detection of the signal on the tuned channel for halting said scanning means operation during said signal presence on said tuned channel and enabling resumption of said scanning means operation in response to termination of said signal on said tuned channel; and means responsive to said detection means for delaying the scanning means operation resumption for a period of time after said signal termination, wherein the improvement comprises:
including memory means means for programming said delaying means to automatically operate only on certain selected ones of said channels thereby facilitating reception of two-way communications on the certain selected channels without delaying the scanning operation on channels having one-way communications.

5. A scanning radio receiver capable of sequentially tuning to a plurality of radio frequencies and comprising:
frequency synthesizing means responsive to the logic state of a plurality of logic signals for determining the radio frequency to which said receiver is tuned;
programmable memory means including an output circuit coupled to said frequency synthesizing means for providing said plurality of logic signals corresponding to one of a plurality of words stored in said memory means;
squelch circuit means responsive to the presence of a radio frequency signal at the frequency to which said receiver is tuned for generating a scanning control signal during the presence of said radio frequency signal;
a scanning circuit responsive to the termination of said scanning control signal to selectively change said plurality of logical signals to correspond to a different one of said plurality of words stored in said memory means thereby changing the frequency to which said receiver is tuned;
rescan delay means including a control input, said rescan delay means responsive to a rescan delay control signal on said control input for inhibiting said scanning circuit from selectively changing said logic signals for a period of time following the termination of said scanning control signal; and
means for programming said memory means to automatically provide said rescan delay control signal only at certain preselected words in said memory.

6. A scanning radio receiver tunable to a plurality of different predetermined radio frequencies comprising:
programmable memory means for storing a plurality of memory words, each of said memory words containing frequency information bits, and only preselected ones of said memory words containing an auxiliary information bit;
squelch circuit means responsive to the presence of a signal above a squelch threshold at the frequency to which said receiver is tuned for generating a scanning control signal;
scanning means responsive to the termination of said scanning control signal for successively scanning said memory means to successively output different ones of said memory words from said memory means; said scanning means responsive to the presence of a scanning control signal to halt said successive scanning of said memory means, thereby locking said receiver onto the tuned radio frequency for the duration of said scanning control signal;
a presettable frequency divider circuit preset in response to said frequency information bits of said memory word output from said memory means during the presence of said scanning control signal;
frequency synthesizing means responsive to said preset frequency divider circuit for establishing the frequency to which said receiver is tuned;
means responsive to the presence of said auxiliary information bit of said memory word output from said memory means during the presence of said scanning control signal to provide an auxiliary output control signal; and
selective rescan delay means responsive to said auxiliary output control signal for automatically inhibiting said successive scanning of said memory means by said scanning means for a period of time following the termination of said scanning control signal only at the memory words containing said auxiliary output control signal.

7. A scanning radio receiver tunable to a plurality of channels corresponding to different discrete radio frequencies, comprising:
a programmable memory for storing a plurality of memory words individually associated with said channels, each of said memory words containing both frequency information bits and a binary valued auxiliary bit;
a frequency synthesizer responsive to the frequency information bits in one of said memory words for establishing the tuned frequency on one of said scanned channels;
a squelch circuit responsive to the presence on a channel to which the receiver is tuned of a signal exceeding a squelch threshold for locking said receiver onto the tuned channel while said signal exceeds said squelch threshold;
a scanning circuit coupled to said squelch circuit and responsive to the termination of said signal exceeding said squelch threshold for successively scanning both said channels and said memory words until a frequency at which said signal exceeds said squelch threshold is established on one of said channels;

a plurality of manually actuated lockout switches individually associated with said channels for preventing said squelch circuit from locking said receiver onto the tuned channel despite the presence at said tuned channel of a signal exceeding said squelch threshold;

programming means coupled to said programmable memory for programming said frequency information bits into said programmable memory and for establishing the value of said binary valued auxiliary bit; and a selective rescan delay circuit operable on only certain selected ones of said channels in accordance with the established binary value of said auxiliary bit in said memory word associated with said scanned channel for automatically and selectively delaying said successive scanning of both said channels and said memory words by said scanning circuit for a period of time following termination of said signal exceeding said squelch threshold.

* * * * *